US011697583B2

(12) United States Patent
Nagel et al.

(10) Patent No.: US 11,697,583 B2
(45) Date of Patent: Jul. 11, 2023

(54) MICROMECHANICAL DEVICE INCLUDING A STOP SPRING STRUCTURE

(71) Applicant: Robert Bosch GmbH, Stuttgart (DE)

(72) Inventors: Cristian Nagel, Reutlingen (DE); Johannes Classen, Reutlingen (DE); Rolf Scheben, Reutlingen (DE); Rudy Eid, Stuttgart (DE)

(73) Assignee: ROBERT BOSCH GMBH, Stuttgart (DE)

( * ) Notice: Subject to any disclaimer, the term of this patent is extended or adjusted under 35 U.S.C. 154(b) by 279 days.

(21) Appl. No.: 17/224,613

(22) Filed: Apr. 7, 2021

(65) Prior Publication Data
US 2021/0323809 A1 Oct. 21, 2021

(30) Foreign Application Priority Data

Apr. 15, 2020 (DE) .......................... 102020204767.7

(51) Int. Cl.
*B81B 7/00* (2006.01)
*B81B 3/00* (2006.01)

(52) U.S. Cl.
CPC .................................. *B81B 3/0027* (2013.01)

(58) Field of Classification Search
CPC ... B81B 3/0027; B81B 3/0035; B81B 3/0056; B81B 7/00; B81B 7/0003; B81B 2201/03
See application file for complete search history.

(56) References Cited

U.S. PATENT DOCUMENTS 6,265,239 B1 * 7/2001 Aksyuk ................. B81B 7/0003
438/51
6,504,643 B1 * 1/2003 Peeters ................. B81B 7/0003
257/415

(Continued)

FOREIGN PATENT DOCUMENTS

DE 102005059905 A1 6/2007
DE 102008042366 A1 4/2010

(Continued)

OTHER PUBLICATIONS

M. Naumann et al., "The Effect of Multi-Directional Stimuli on the Stiction-Induced Failure Behavior of MEMS," Journal Microelectromech Systems, 2016, vol. 25, No. 3, pp. 432-439.

*Primary Examiner* — David M Fenstermacher
(74) *Attorney, Agent, or Firm* — Norton Rose Fulbright US LLP; Gerard Messina

(57) ABSTRACT

A micromechanical device including a substrate, a movable mass, and a stop spring structure, which includes a stop. The substrate includes a substrate surface in parallel to a main extension plane and the movable mass is situated movably above the substrate surface in relation to the substrate. The stop spring structure is connected to the movable mass. The stop is designed to strike against the substrate surface in the event of a deflection of the movable mass in a z direction, perpendicular to the main extension plane. The stop spring structure, at the location of the stop, includes a first spring constant, a second spring constant, in parallel to the main extension plane, and a third spring constant, in parallel to the main extension plane and perpendicular to the x direction. The first spring constant is greater than the second spring constant and/or is greater than the third spring constant.

7 Claims, 5 Drawing Sheets

(56) References Cited

U.S. PATENT DOCUMENTS

| | | | |
|---|---|---|---|
| 10,488,430 B2 | 11/2019 | Enjalbert | |
| 10,703,625 B1* | 7/2020 | Yeh | B81B 3/0027 |
| 11,333,679 B1* | 5/2022 | Senkal | G01P 15/131 |
| 2010/0186508 A1 | 7/2010 | Guenther et al. | |
| 2010/0207489 A1* | 8/2010 | Huang | B81C 1/00182 |
| | | | 29/25.35 |
| 2013/0015743 A1 | 1/2013 | Tsai | |
| 2014/0298910 A1 | 10/2014 | Simoni et al. | |
| 2016/0101975 A1* | 4/2016 | Ono | G01C 19/5712 |
| | | | 257/419 |
| 2018/0033564 A1* | 2/2018 | Campardo | H01H 1/0036 |
| 2019/0011259 A1* | 1/2019 | Lin | G01C 19/5733 |
| 2021/0323809 A1* | 10/2021 | Nagel | G01C 19/5755 |
| 2022/0144623 A1* | 5/2022 | Reinmuth | B81B 3/0027 |
| 2022/0179195 A1* | 6/2022 | Efrati | G02B 26/0841 |
| 2022/0252635 A1* | 8/2022 | Dewall | H01G 5/16 |
| 2022/0326353 A1* | 10/2022 | Loya | G02B 26/101 |

FOREIGN PATENT DOCUMENTS

| | | |
|---|---|---|
| DE | 102008043753 A1 | 5/2010 |
| DE | 102012207939 A1 | 11/2013 |
| DE | 102014212314 A1 | 12/2015 |
| DE | 102018221110 B3 | 2/2020 |
| EP | 0244581 | 11/1987 |
| EP | 0773443 | 5/1997 |
| EP | 3111232 A1 | 1/2017 |
| WO | 2015128819 A1 | 9/2015 |
| WO | 2018026032 A1 | 2/2018 |

* cited by examiner

MICROMECHANICAL DEVICE INCLUDING A STOP SPRING STRUCTURE

CROSS REFERENCE

The present application claims the benefit under 35 U.S.C. § 119 of German Patent Application No. DE 102020204767.7 filed on Apr. 15, 2020, which is expressly incorporated herein by reference in its entirety.

BACKGROUND INFORMATION

The present invention is directed to a micromechanical device including a substrate, a movable mass, and a stop spring structure, which includes a stop, the substrate including a substrate surface in parallel to a main extension plane x, y and the movable mass being situated movably in relation to the substrate above the substrate surface, the stop spring structure being connected to the movable mass and the stop being designed to strike against the substrate surface in the event of a deflection of the movable mass in a z direction, perpendicular to main extension plane x, y. Such devices are available in the related art, for example, as z acceleration sensors in a rocker construction.

Micromechanical inertial sensors for measuring acceleration and rotation rate are manufactured in mass production for various applications in the automotive and consumer areas. For capacitive acceleration sensors including a detection direction perpendicular to wafer plane x, y, i.e., in the z direction or out-of-plane direction, asymmetrically suspended seismic masses, so-called "rockers" are frequently used. The sensor principle of these rockers is based on a spring-mass system in which, in the simplest case, a movable seismic mass including two counter electrodes fixed on the substrate forms two plate capacitors. The seismic mass is connected to the base via at least one, but for reasons of symmetry usually rather two torsion springs. If the mass structures on the two sides of the torsion springs are of different sizes, the mass structure will thus rotate in relation to the torsion spring as the axis of rotation upon the action of a z acceleration. The distance of the electrodes thus becomes smaller on the side having the greater mass and becomes greater on the other side. The capacitance change is a measure of the acting acceleration. These acceleration sensors are described, for example, in European Patent Nos. EP 0 244 581 and EP 0 773 443 B1.

One important aspect in the technical refinement of micromechanical sensors is increasing the mechanical robustness and overload resistance. New installation locations result due to new areas of application and thus, under certain circumstances, also novel load profiles including increasing robustness demands for the sensors.

One possible error pattern is the adherence, in which the movable sensor mass remains stuck on a mechanical fixed stop when the adhesion forces in the stop are greater than the restoring forces of the spring-mass system. The novel load profiles may also have the result that the tendency to adhere increases over the lifetime of the component. It is therefore necessary both to keep the influence of the additional load on the tendency to adhere low, and also to increase the robustness against sticking in general.

To reduce the risk of adherence, knob stops are often used for z acceleration sensors, as shown as an example in FIGS. 1a and 1b. German Patent Application No. DE 10 2005 059 905 A1 describes a possible manufacturing method and a possible arrangement of the knobs for this purpose. German Patent Application No. DE 10 2008 042 366 A1, U.S. Patent Application Publication No. US 2013 0 015 743 A1, German Patent Application No. DE 10 2014 212 314 A1, U.S. Patent Application Publication No. US 2014 0 298 910 A1, and PCT Patent Application Publication No. WO 2018 026 032 A1 describe further fixed out-of-plane stops.

In FIG. 1, the knobs are situated on the lower side of the movable sensor structure, corresponding to German Patent Application No. DE 10 2005 059 905 A1. The adhesive forces are relatively low due to the reduced stop area and thus the risk of adhering is low in the case of occasional touching. However, a hard fixed stop tends toward the above-described error mechanisms (adherence, particle formation) in the event of frequent overload. Therefore, various resilient stops have been proposed in the past, which, on the one hand, cushion the impact on the stop, thus reduce the mechanical damage to the stop surfaces, and, on the other hand, offer increased restoring force in the event of great overload, since in addition to the restoring force of the function springs of the sensor, the stop spring also contributes to the restoring force. German Patent Application No. DE 10 2008 043 753 A1 shows a sensor including a resilient stop, which is implemented in the same functional plane as the seismic mass. European Patent No. 3 111 232 B1 shows a very similar arrangement, however, the stop may act here not only in one direction, but on both sides, i.e., both in the direction of the base electrodes and in the direction of the sensor cap. German Patent Application No. DE 10 2012 207 939 A1 describes a resilient stop which is formed from a second thin functional layer below or above a thicker functional layer. In this case, the stop may take place in the direction of the base electrodes if the thin functional layer is situated below the thick functional layer. If the thin layer is situated above the thick functional layer, in contrast, the stop may take place in the direction of the sensor cap.

Furthermore, the tendency to adhere may also be influenced by forces acting perpendicularly to the stop direction. This is described, for example, in U.S. Pat. No. 10,488,430 B2 and the article "The Effect of Multi-Directional Stimuli on the Stiction-Induced Failure Behavior of MEMS" by M. Naumann et al., J. Microelectromech. Systems, Vol. 25, No. 3, 432-439. The precise microscopic mechanisms for the increased tendency to adhere in the case of additional occurring lateral accelerations are not yet definitively clarified. The anti-adhesive layer is possibly damaged more strongly by the lateral sliding over the contact surface than in the case of a solely vertical contact.

SUMMARY

The object of the present invention is to provide a micromechanical device which is mechanically robust with respect to accelerations, which simultaneously have components perpendicular to the main plane of the substrate, i.e., in the z direction, and in parallel to the main plane of the substrate, i.e., in the x, y directions.

The present invention is directed to a micromechanical device including a substrate, a movable mass, and a stop spring structure, which includes a stop, the substrate including a substrate surface in parallel to a main extension plane x, y and the movable mass being situated movably in relation to the substrate above the substrate surface, the stop spring structure being connected to the movable mass and the stop being designed to strike against the substrate surface in the event of a deflection of the movable mass in a z direction, perpendicular to main extension plane x, y.

In accordance with an example embodiment of the present invention, the stop spring structure has a first spring constant Kz at the location of the stop in the z direction, has a second spring constant Kx in a x direction, in parallel to the main extension plane x, y, and has a third spring constant Ky in a y direction, in parallel to the main extension plane x, y and perpendicular to the x direction, first spring constant Kz being greater than second spring constant Kx or also being greater than third spring constant Ky.

According to an example embodiment of the present invention the present invention, the stop spring structure of the z stop of a movable mass is designed in such a way that it has a defined, comparatively high spring stiffness in the z direction and in addition a very low spring stiffness in at least one direction x or y perpendicular thereto. Shear loads between the stop and the substrate surface of the micromechanical device are thus advantageously reduced.

One advantageous embodiment of the present invention provides that the stop spring structure includes a first stop spring which is connected to the movable mass in at least one first connecting area. It is particularly advantageous that the first stop spring is connected to the movable mass in a second connecting area and is a torsion spring or a meander spring or a combination thereof. Such springs may advantageously be made very soft in parallel to the main extension plane. The rocker function of a torsion spring may thus also advantageously be linked to the deflectability in the x and y directions.

One advantageous embodiment of the present invention provides that the first stop spring is a spiral spring. This spring advantageously manages with only one connecting area to the movable mass. A very large effective spring length on a small footprint may advantageously be implemented using a spiral spring.

It is particularly advantageous if the stop spring structure includes a second stop spring, which is connected to the first stop spring. Spring constants Kz (perpendicular to the main extension plane), and Kx, Ky (in parallel to the main extension plane) may thus advantageously be set largely independently of one another.

It is particularly advantageous that second spring constant Kx or also third spring constant Ky is less than 60%, preferably less than 30%, of first spring constant Kz.

DETAILED DESCRIPTION OF EXAMPLE EMBODIMENTS

The force acting on a spring is, in a first approximation, proportional to the deflection of the spring.

$F=K*L$, where F is the force, K the spring constant, and L the deflection.

The stop spring structure of the device according to the present invention enables deflections in all (Cartesian) spatial directions x, y, z. The stop spring structure includes different spring constants and thus different restoring forces as a function of the direction of the deflection.

$$F(x,y,z)=K(x,y,z)*L(x,y,z)$$

In order that, if possible, no lateral movement results over the surface of the stop in the x or y direction, the spring constant, also referred to as the spring rigidity or spring stiffness, perpendicular to stop direction z is to be less than a certain percentage of the spring stiffness in the stop direction. This results from the coefficient of friction and from the maximum expectable force vector if one presumes that the external force vector during an impact does not significantly change the direction. The spring rigidity in directions perpendicular to stop direction z is particularly preferably to be less than 30% of the spring rigidity in the stop direction, but at least less than 60%.

There are many options for designing the resilient stops in such a way that they correspond to the above requirements.

Figure 1B:
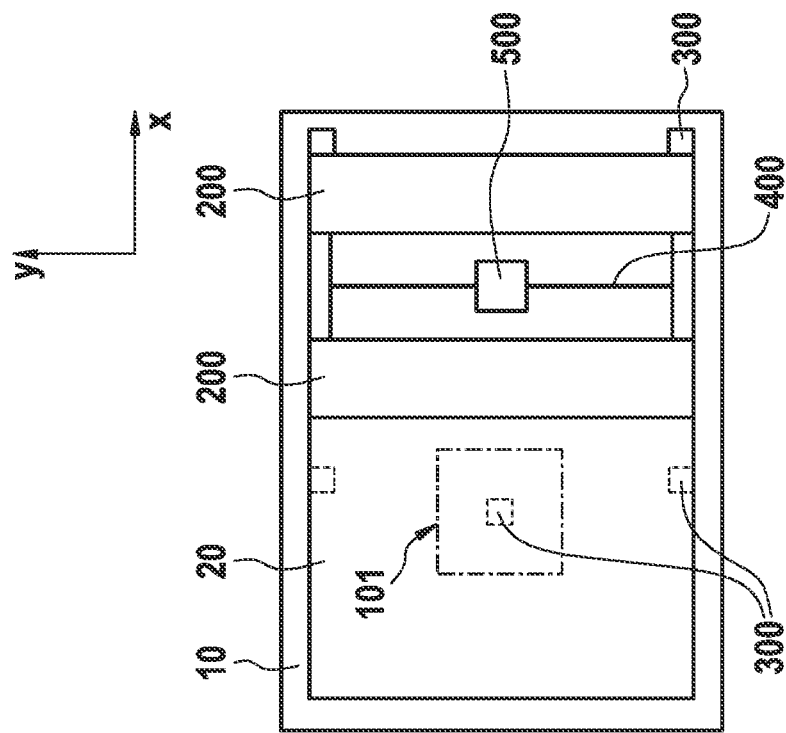
FIGS. 1a and 1b schematically show a z acceleration sensor in the related art.
Figure 1A:
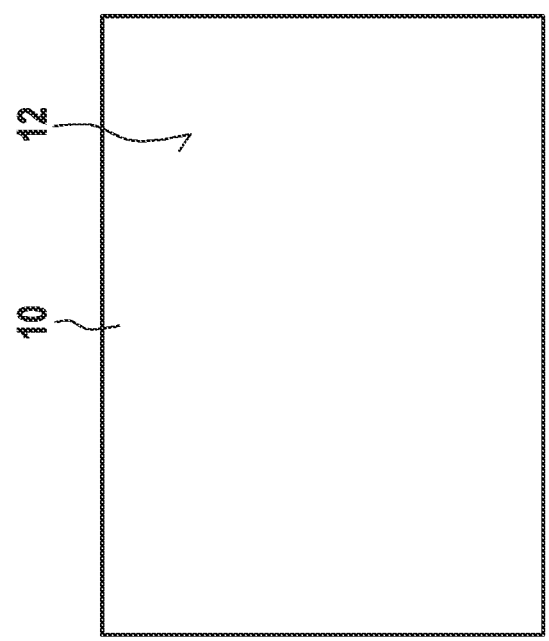

FIGS. 1a and 1b schematically show a z acceleration sensor in the related art.

FIG. 1a shows a substrate 10, the base of a sensor core here, including a substrate surface 12. FIG. 1b shows a micromechanical device, in the example a z acceleration sensor, including a substrate 10 and a movable mass 20, which is suspended asymmetrically with the aid of torsion springs 400 on an anchor 500. The anchor is fastened at the substrate and holds the movable mass above substrate surface 12. Substrate surface 12 extends in parallel to a main extension plane x, y. The movable mass is situated movably in relation to the substrate above the substrate surface. Electrodes 200, using which a distance of the movable mass to the substrate surface may be measured, are situated below the movable mass on the substrate surface. The movable mass includes fixed stops in the form of knobs 400 on a lower side opposite to the substrate surface. In the event of a deflection of the movable mass in the z direction, i.e., perpendicularly to main extension plane x, y, these knobs 400 strike at substrate surface 12. The schematic representation shows a z acceleration sensor according to the rocker principle in a transparent top view.

To illustrate the present invention described hereinafter, an area 101 is marked in which a stop spring structure according to the present invention could be implemented. Of course, this is not the only possible area. For example, resilient stops would also be implemented on the opposite side of the sensor.

Figure 2B:
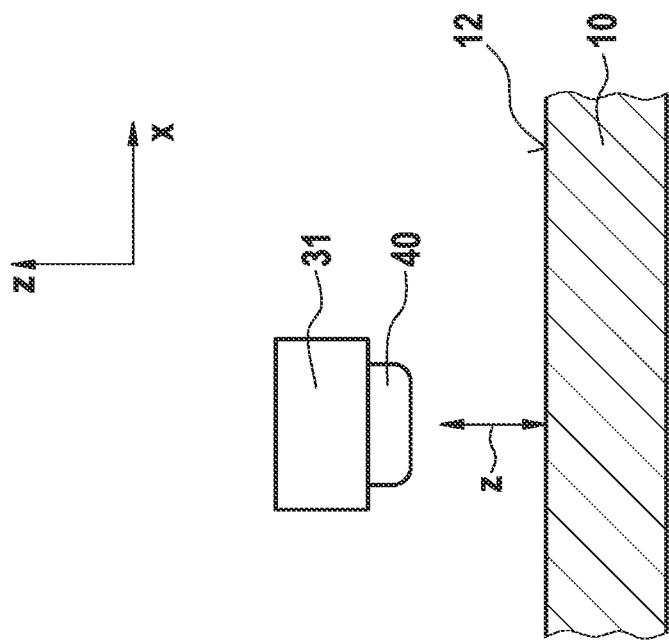
FIGS. 2a and 2b schematically show a micromechanical stop structure according to the present invention in a first exemplary embodiment.
Figure 2A:
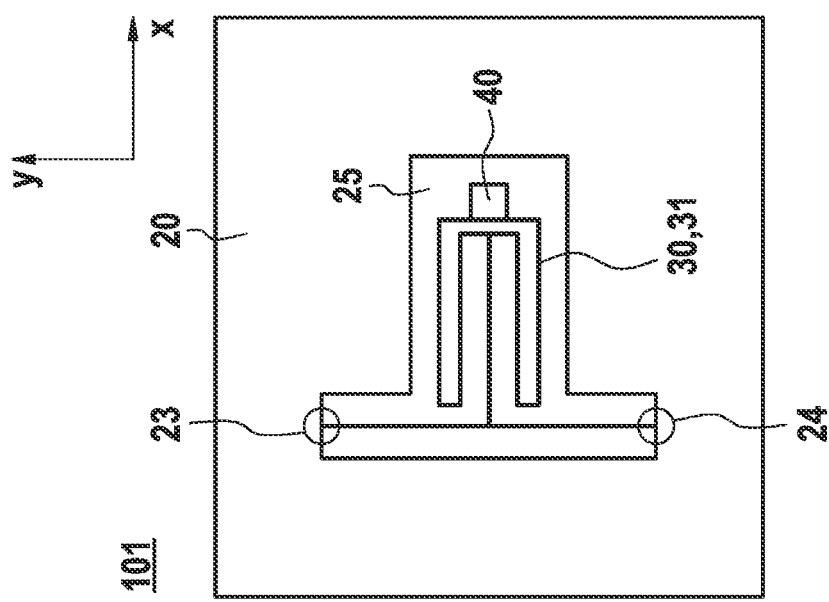

FIGS. 2a and 2b schematically show a micromechanical stop structure according to the present invention in a first exemplary embodiment. It is situated in enlarged detail 101 of the micromechanical device.

FIG. 2a shows partially seismic mass 20 including a recess 25. A stop spring structure 30 having a first stop spring 31 is situated in the recess. The first stop spring is connected in a first connecting area 23 and in a second connecting area 24 to movable mass 20. The first stop spring is made up of a combination of a torsion spring and a loop spring or a meander spring. The location of stop 40 is located in the center of the active spring length.

FIG. 2b shows the location of the stop in section. Stop 40 is situated on first stop spring 31 and has the form of a knob in this example. In the event of a deflection of the movable mass in the z direction, stop 40 may strike against substrate surface 12. The knob protrudes for this purpose beyond the surface of the seismic mass and the stop spring structure opposite to the substrate. Stop spring structure 30 has, at the location of stop 40, a first spring constant Kz in the z direction, a second spring constant Kx in an x direction, in parallel to main extension plane x, y, and a third spring constant Ky in a y direction, in parallel to main extension plane x, y and perpendicular to the x direction. First spring constant Kz is greater than second spring constant Kx and also greater than third spring constant Ky.

A spring construction is thus shown in FIGS. 2a and 2b which is soft in in-plane directions x, y due to the narrow and folded spring bars and has the desired higher spring rigidity in out-of-plane direction z, since the spring bars are significantly taller than they are wide.

If stop 40 rests against substrate surface 12 due to a z acceleration and an acceleration in the x or y direction additionally occurs, stop spring structure 30 yields in the x or y direction. Therefore, the stop does not scrape over the substrate surface in parallel to the main extension plane. The stop remains at rest on the substrate surface.

Figure 3B:
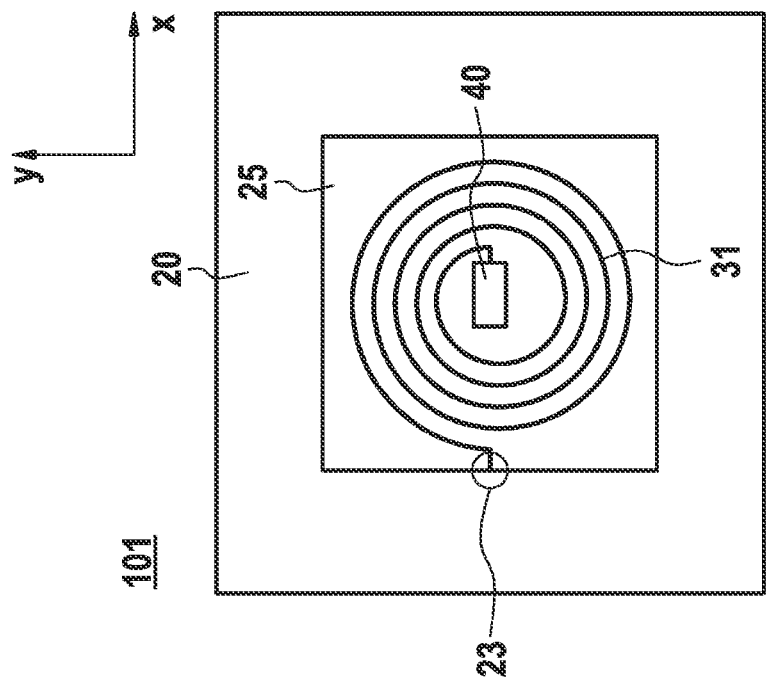
FIGS. 3a and 3b schematically show a micromechanical stop structure according to the present invention in a second and third exemplary embodiment.
Figure 3A:
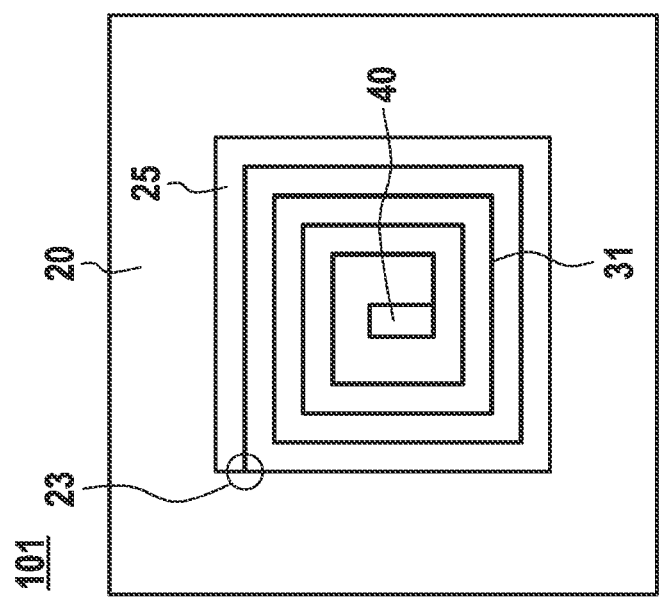

FIGS. 3a and 3b schematically show a micromechanical stop structure according to the present invention in a second and third exemplary embodiment.

A stop spring structure 30 including a first stop spring 31 in a spiral construction is shown.

FIG. 3a shows a spiral-shaped structure of the spring including linear, angled spring bars in sections.

FIG. 3b shows a classic spiral spring including a curved spring bar. First stop spring 31 is situated in each case in a recess 25 in movable mass 20 and is connected to the movable mass in a first connecting area 23. Stop 40 is situated at the other end of the effective spring length.

The constructions shown in FIGS. 2a, 2b, 3a and 3b may be implemented in a single micromechanical functional layer, with the exception of the stop knob itself.

Figure 4B:
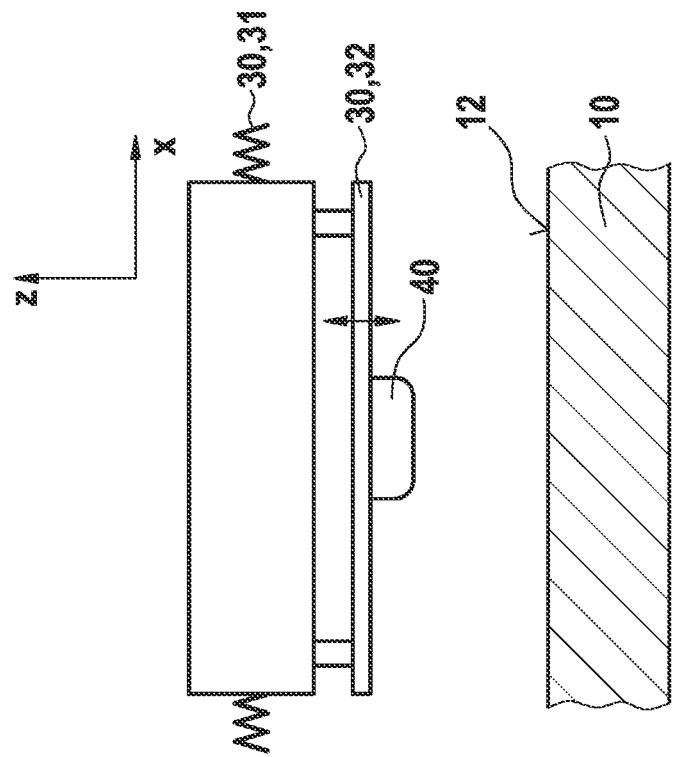
FIGS. 4a and 4b schematically show a micromechanical stop structure according to the present invention in a fourth exemplary embodiment.
Figure 4A:
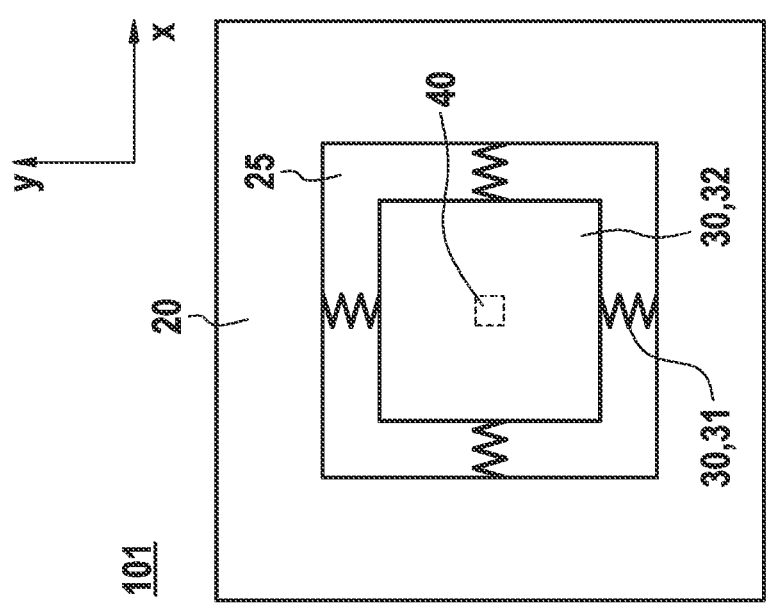

FIGS. 4a and 4b schematically show a micromechanical stop structure according to the present invention in a fourth exemplary embodiment.

FIG. 4a shows a partially transparent top view from above of section 101 including movable mass 20 and recess 25, in which stop spring structure 30 is situated. A first stop spring 31 is schematically shown by spring symbols in directions x and y. It is connected at the location of the stop to a second stop spring 32, which includes stop 40 at a lower side.

FIG. 4b shows the location of the stop in section. Stop spring structure 30 including first stop spring 31 is shown, partially in a symbolic illustration. Second stop spring 32, which is deflectable in z direction, is situated below the first stop spring and connected thereto. Stop 40 is situated in the form of a stop knob at the second stop spring. In the event of a deflection of the movable mass and with it stop spring structure 30 in the z direction, stop 40 may strike against substrate surface 12 of substrate 10.

The movable mass and the first stop spring are situated in a first micromechanical functional layer. Situating the second stop spring below the first stop spring represents an additional degree of freedom in the design of the micromechanical device, which results due to the use of a second functional layer. Using the construction shown, the symbolically indicated spring elements of first stop spring 31 may be made very soft in the x and y direction, while they have a high rigidity perpendicular to the main plane, in the z direction. The rigidity of stop spring structure 30 at the location of stop 40 is essentially determined by second stop spring 32, which is formed in the second functional layer.

Figure 5C:
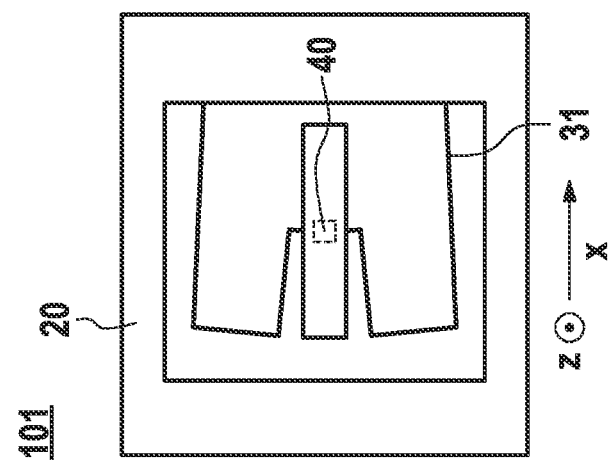
FIGS. 5a, 5b, and 5c schematically show a micromechanical stop structure according to the present invention in a fifth exemplary embodiment in three operating states.
Figure 5B:
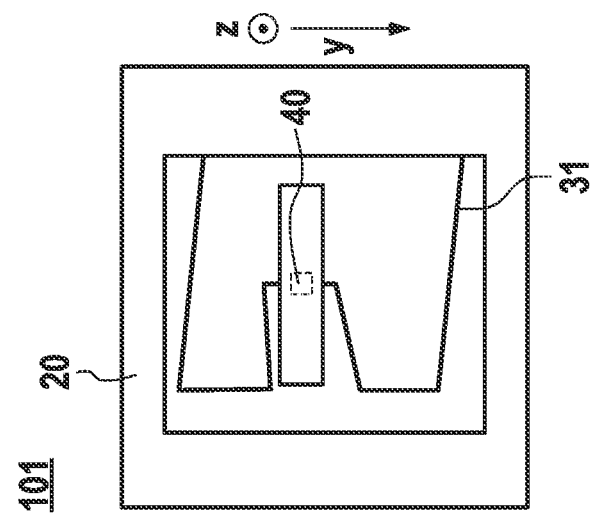
Figure 5A:
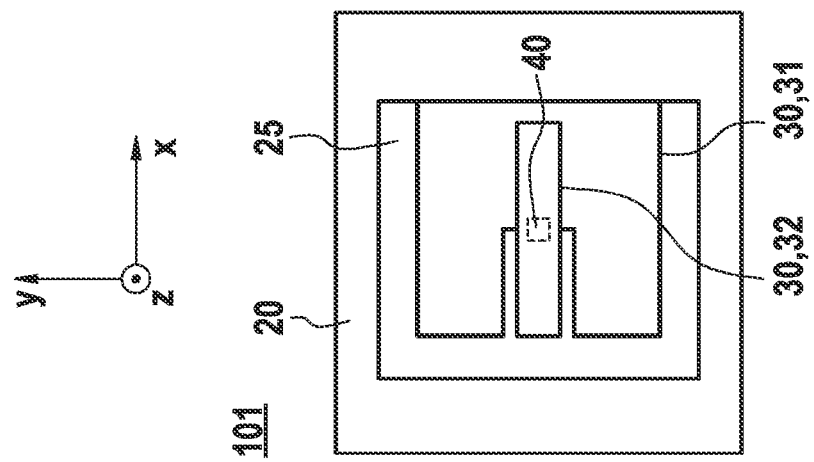

FIGS. 5a, 5b, and 5c schematically show a micromechanical stop structure according to the present invention in a fifth exemplary embodiment in three operating states. One possible implementation of the embodiment from FIGS. 4a and 4b is shown in FIG. 5a. The construction of first stop spring 31 is made up of 2 U springs, which have a large distance of the legs from one another. This spring construction is thus soft in both directions x and y in parallel to main extension plane x, y. Second stop spring 32 is designed including a rectangular footprint and otherwise corresponds to the construction from FIGS. 4a and 4b. It is apparent that the unused area of recess 25, which is empty in the illustration, may be filled up with seismic mass 20 in such a way that the freedom of movement of the stop spring structure is not restricted.

FIG. 5a shows the micromechanical device in a first operating state in an idle position. Movable mass 20 and stop spring structure 30 are not deflected. Stop 40 has no mechanical contact with the underlying substrate.

FIG. 5b shows the micromechanical device in a second operating state. During a sustained deflection in the z direction, in the case of which stop 40 strikes against the substrate surface, a deflection of movable mass 20 in the y direction additionally occurs. First spring constant Kz is greater than third spring constant Ky. Stop 40, therefore, remains stationary on the substrate surface, and first stop spring 31 yields in the y direction.

FIG. 5c shows the micromechanical device in a third operating state. During a sustained deflection in the z direction, in the case of which stop 40 strikes against the substrate surface, a deflection of movable mass 20 in the x direction additionally occurs. First spring constant Kz is greater than second spring constant Kx. Stop 40, therefore, remains stationary on the substrate surface, and first stop spring 31 yields in the x direction.

LIST OF REFERENCE NUMERALS 10 substrate
12 substrate surface
20 movable mass
23 first connecting area
24 second connecting area
25 recess
30 stop spring structure
31 first stop spring
32 second stop spring
40 stop
101 enlarged detail
200 electrode
300 fixed stop, knob
400 torsion spring
500 anchor

What is claimed is:

1. A micromechanical device, comprising:
a substrate including a substrate surface in parallel to a main extension plane;
a movable mass situated movably above the substrate surface in relation to the substrate; and
a stop spring structure which includes a stop, the stop spring structure being connected to the movable mass, and the stop is configured to strike against the substrate surface in the event of a deflection of the movable mass in a z direction, perpendicular to the main extension plane, the stop spring structure, at the location of the stop, includes a first spring constant in the z direction, includes a second spring constant in an x direction, in parallel to the main extension plane, and includes a third spring constant in a y direction, in parallel to the main extension plane and perpendicular to the x direction, the first spring constant being greater than the second spring constant and/or being greater than the third spring constant.

2. The micromechanical device as recited in claim 1, wherein the stop spring structure includes a first stop spring, which is connected in at least one first connecting area to the movable mass.

3. The micromechanical device as recited in claim 2, wherein the first stop spring is connected in a second connecting area to the movable mass and is a torsion spring and/or a meander spring.

4. The micromechanical device as recited in claim 2, wherein the first stop spring is a spiral spring.

5. The micromechanical device as recited in claim 2, wherein the stop spring structure includes a second stop spring, which is connected to the first stop spring.

6. The micromechanical device as recited in claim 1, wherein the second spring constant and/or the third spring constant is less than 60% of the first spring constant.

7. The micromechanical device as recited in claim 1, wherein the second spring constant and/or the third spring constant is less than 30% of the first spring constant.

* * * * *